United States Patent [19]

Taylor et al.

[11] 3,999,069
[45] Dec. 21, 1976

[54] PYROELECTRIC TEMPERATURE COMPENSATED SENSING DEVICE EMPLOYING DIFFERENTIAL AMPLIFIER

[75] Inventors: Allen L. Taylor, Woodbury; Francis J. McFadden, Lake Elmo, both of Minn.

[73] Assignee: Minnesota Mining & Manufacturing Company, St. Paul, Minn.

[22] Filed: Aug. 8, 1975

[21] Appl. No.: 603,176

[52] U.S. Cl. .............................. 250/338; 250/342
[51] Int. Cl.² ........................................ G01J 1/00
[58] Field of Search .......... 250/338, 340, 342, 349, 250/353

[56] References Cited
UNITED STATES PATENTS

| | | | |
|---|---|---|---|
| 3,839,640 | 10/1974 | Rossin | 250/353 |
| 3,896,311 | 7/1975 | Taylor et al. | 250/338 X |

*Primary Examiner*—Davis L. Willis
*Attorney, Agent, or Firm*—Alexander, Sell, Steldt & DeLaHunt

[57] ABSTRACT

A temperature compensated sensing device for sensing a particular condition includes first and second conductive layers in surface-to-surface contact with and separated by a layer of poled, pyroelectric material. In a preferred embodiment, the second conductive layer is electrically grounded and the first conductive layer is etched to define two interdigitated, electrically unconnected sets of conductive portions. The sets of conductive portions are heated when exposed to the condition desired to be detected and, in turn, heat areas of the pyroelectric layer. As a result, electrostatic charges are developed on the heated pyroelectric areas and appear as voltage potentials on the heated conductive portions. Electronic circuitry having a differential amplifier is electrically connected to the conductive portions for sensing the voltage potentials thereon and for triggering an alarm when certain voltage potentials exist. In a first modified embodiment, the first conductive layer is electrically grounded and the second conductive layer contains the interdigitated conductive portions, and in a second modified embodiment neither of the conductive layers is grounded.

4 Claims, 7 Drawing Figures

PYROELECTRIC TEMPERATURE COMPENSATED SENSING DEVICE EMPLOYING DIFFERENTIAL AMPLIFIER

BACKGROUND OF THE INVENTION

1. Field of the Invention

The present invention relates in general to sensing devices and more specifically to such devices that employ a pyroelectric material for sensing.

2. Description of the Prior Art

Pyroelectric sensing devices have recently become well known in the art. One of the major problems that is inherent in pyroelectric sensing devices is that they must be temperature compensated in order to minimize erroneous readings due to ambient temperature changes in the vicinity of the device. A recently issued patent to Rossin, U.S. Pat. No. 3,839,640 discloses a detector developed to overcome the problem of ambient temperature changes by employing a pyroelectric film that is coated on its front surface with a pair of conductive strips and on its back surface with a U-shaped conductive strip in back-to-back relationship with the front strips.

The Rossin detector includes a front mirror reflector so that radiation desired to be detected will be focused on only one of the front conductive strips. The front conductive strips are connected to an electronic sensing circuit in such fashion that when only one of the front conductive strips is heated a sensing indication will be provided, and when both front conductive strips are heated by a change in ambient temperature no sensing indication results. Accordingly, the Rossin detector achieves the goal of temperature compensation. However, because of such compensation the sensitivity of the Rossin detector is substantially lower than that of a noncompensated detector. The reduced sensitivity results because the conductive strips of the Rossin detector form two capacitors that are electrically connected in parallel. Since voltage provided the sensing circuit due to the heating of the conductive strips is inversely proportional to the amount of circuit capacitance, the parallel capacitors of Rossin provide less sensing voltage than would be provided if only a single capacitor were used.

SUMMARY OF THE INVENTION

The present invention provides a temperature compensated sensing device that is highly sensitive and includes a pyroelectric layer that is sandwiched between first and second conductive layers, one of which is etched to form at least two electrically unconnected portions. Electronic circuitry is connected to each etched conductive portion and is employed for sensing the voltage potentials of the conductive portion and for providing a sensing indication when certain pattern voltage potentials are sensed.

At the input of the electronic circuitry, a differential amplifier responds to the voltage potential of each conductive portion and has an output equal to the difference between the magnitudes of the voltage potentials of the conductive portions. Although the operation of the detector is dependent upon the ability of the electronic circuitry to sense the voltage potentials of the conductive areas the differential amplifier prevents actuation of the detector alarm when both conductive areas have the same voltage potential. Accordingly, the use of two conductive areas in cooperation with the differential amplifier serves to immunize the detector from sensing variations in the ambient temperature of the environment in which the detector is located. In a preferred embodiment of the present invention, the first conductive layer is etched to form the conductive portion and the second conductive layer is electrically grounded. A first modified embodiment of the present invention differs in construction from that of the preferred embodiment in that the conductive layer of etched portions is in the second layer and the electrically grounded conductive layer is in the first layer. Such construction provides the advantage of eliminating spurious, electrostatic pickup by the detector. In a second modified embodiment neither of the conductive layers are grounded.

DESCRIPTION OF THE PREFERRED EMBODIMENTS

Figure 1:
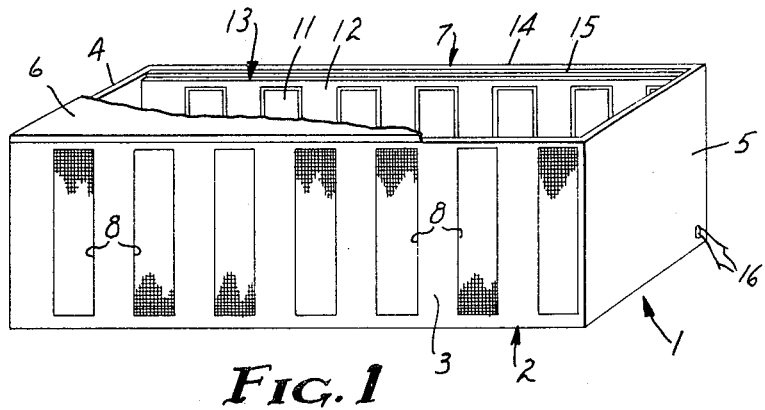
FIG. 1 is an enlarged perspective view of a detector employing a preferred embodiment of the sensing device of the present invention, with a portion of the top wall of the detector cut away to expose interior construction.

Referring now to the drawings and specifically to FIG. 1, a motion and temperature sensitive infrared radiation detector 1 that employs a preferred embodiment of the present invention is shown. The detector 1 is adapted to preferably sense the presence of a moving infrared radiation source such as an intruder in a home or office and, thus, may be used as an integral component of a burgler alarm system. The detector 1 is passive in that it includes no radiation transmitting components and its operation is entirely dependent upon the receipt of radiation from a source that it detects.

Included in the detector 1 are a rectangularly shaped housing 2 having a front wall 3, a pair of opposite sidewalls 4 and 5, a top wall 6, a bottom wall (not shown) and a back wall 7. The dimensions of the housing 2 are a matter of choice and primarily depend on the degree of sensitivity desired of the detector. The housing 2 may be built small enough and of such design that it can be used as an ornament placed in the room of one's home without alerting an intruder to its purpose. The amount of spacing between the front wall 3 and the back wall 7 is not critical and may be sufficiently small that a detector of the present invention could be built in the form of a picture. The use of the housing 2 is not essential to the operation of the present invention and instead the detector 1 may be formed with merely the front wall 3 and the back wall 7 together with spacing means therebetween.

The housing front wall 3 is formed of a material that may be either radiation absorbent or reflective. However, radiation is permitted to pass through the wall 3 without obstruction by means of a plurality of vertical, laterally spaced apart rectangular apertures 8 that are filled with a radiation transmissive material. The sidewalls 4 and 5, the top wall 6 and the bottom wall (not shown) are also radiation absorbent or reflective and connect between the front wall 3 and the back wall 7.

Figure 2:
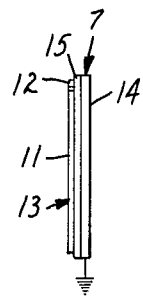
FIG. 2 is an end view of the back wall of the detector of FIG. 1, with the thickness of the layers forming the back wall enlarged.

Referring now to FIG. 2, the back wall 7 is formed of a three layer construction having an inner conductive layer 13, an outer conductive layer 14 that is electrically grounded, and an intermediate layer 15 of a poled pyroelectric material. All three layers of the back wall 7 are in surface-to-surface physical contact with one another. The layer 15 may be formed from such materials as a thin sheet of polyvinylidene fluoride or a ceramic plate of lanthanum-modified lead zirconate-titanate.

Although a few pyroelectric materials have dipoles that are naturally aligned in a poled relationship, normally the dipoles of pyroelectric materials are essentially arranged in random fashion. These dipoles can be rearranged in orientation when a pyroelectric material is heated above a particular temperature known as the poling temperature. At the poling temperature, the dipoles of a pyroelectric material will orient themselves in accordance with an applied electric field. The degree of dipole orientation is a function of the temperature to which the pyroelectric material is heated, the applied field strength and length of time the field is applied. For example, substantial poling begins in polyvinylidene fluoride when it is heated to a temperature greater than 90° C and an electric field of at least 4,000 volts per millimeter of thickness is applied for approximately 15 minutes. Increasing the temperature and/or the applied electric field will progressively increase the degree of poling achieved up to a maximum of saturation.

Once a pyroelectric material is poled and then cooled below its poling temperature, the applied field may be removed and the dipoles will remain as oriented by the applied field. The pyroelectric material will thereafter produce opposite electrostatic charges on its planar surfaces when heated or cooled beyond an ambient temperature. Care should be taken though to insure that the material is not heated above its poling temperature for extended periods in order that the dipoles are not permitted to return to a random orientation.

Figure 3:
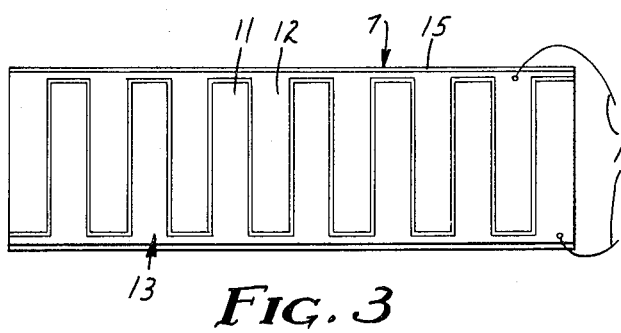
FIG. 3 is a front view of the back wall of FIG. 2.
Figure 4:
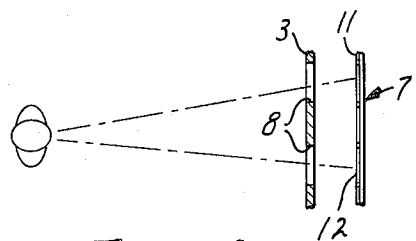
FIG. 4 is a diagrammatic plan view indicating how a fragmentary portion of the front wall of the detector of FIG. 1 selectively permits rays from a radiation source to pass therethrough to expose the back wall of the detector of FIG. 1.

The inner layer of the back wall 7 is etched to preferably define two electrically unconnected sets of interdigitated fingers 11 and 12 that are parallel to the front wall apertures 8, and are substantially equal in surface area to one another as best illustrated in FIG. 3. The dimensions of the finger sets 11 and 12 are not critical, and can be varied depending upon the dimensions of the housing 2. It is preferable, however, that the width of the individual fingers of the finger sets 11 and 12 and the apertures 8 each have approximately a 1 to 4 relationship with the distance between the front wall 3 and the back wall 7. Such relationship between the width of the interdigitated fingers of the sets 11 and 12, the apertures 8, and the distance between the front wall 3 and the back wall 7 is essential to the proper operation of the present invention so that an infrared radiation source moving about in front of the detector 1 will be on a line of sight primarily with only one set of the fingers 11 or 12 at any particular location as indicated by FIG. 4. During movement of the source to a new location, it will alternatively expose the fingers 11 and 12 to radiation, one set at a time.

When either of the finger sets 11 or 12 is heated by exposure to radiation the portions of the pyroelectric layer 15 in contact with the particular finger set exposed are also heated. As a result, electrostatic charges of opposite polarities are developed on the opposed surfaces of the heated portions of the layer 15. The layer 15 is nonconductive, which means that the electrostatic charges developed thereon are limited to the heated portions of the layer 15 and appear on the exposed, contacting finger set 11 or 12. For optimum sensing operation of the detector 1, the etched division between the finger sets 11 and 12 should be at least equal to the thickness of the layer 15 in order that heating of one of the sets 11 or 12 will produce heating throughout the entire cross section of the portions of the layer 15 contacting the heated finger set 11 or 12 without appreciably heating the portions of the layer 15 in contact with the unheated finger set.

As shown in FIG. 3, an electrical lead 16 is connected to each of the finger sets 11 and 12 to couple the fingers 11 and 12 with the electronic circuitry of the detector 1, which circuitry may be located at a remote position or in a compartment on one of the back or side walls of the detector 1. It is necessary, however, that the pyroelectric layer 15 be insulated from the electronic circuitry to prevent the heat produced thereby from affecting the ambient temperature of the layer 15.

Figure 5:
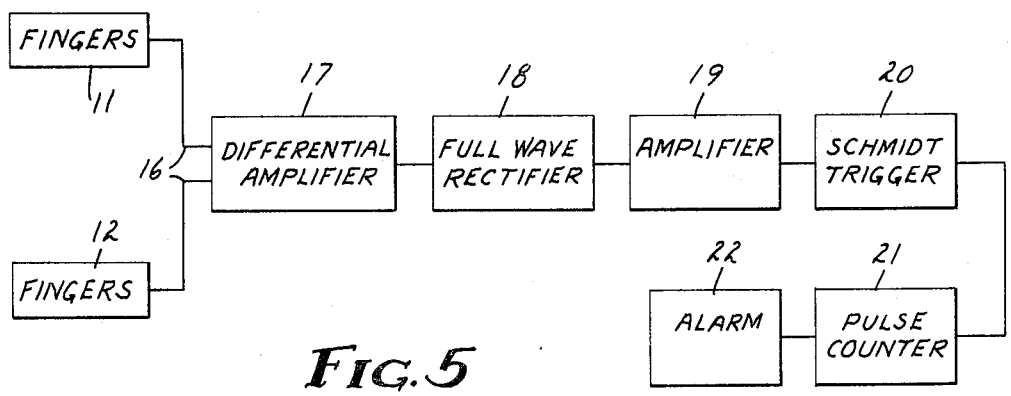
FIG. 5 is a block diagram of the electronic circuitry associated with the detector of FIG. 1.

Referring now to FIG. 5, the set of fingers 11 and 12 are shown forming a portion of a block diagram of the electronic circuitry employed with the detector 1. Such circuitry includes a differential amplifier 17, a full wave rectifier 18, a voltage amplifier 19, a Schmitt trigger 20, a pulse counter 21 and an alarm 22. This electronic circuitry converts a certain pattern of voltage potentials on the fingers 11 and 12 into a signal for triggering the alarm 22 in the following manner.

A voltage potential present on one or both of the sets of fingers 11 or 12 causes current flow therefrom through the respective leads 16 of the charged fingers to the differential amplifier 17. The current flow is equal to the pyroelectric coefficient of the material forming the layer 15 multiplied by the product of the charged surface area of the layer 15 and the rate of change in temperature of such surface area. In response to current flow from the charged finger sets 11 and/or 12, the differential amplifier 17 produces an output equal to the difference between the absolute magnitudes of the voltage potentials on the finger sets 11 and 12. This means that if both finger sets 11 and 12 are equally exposed to radiation, the voltage potentials that appear thereon will be equal in magnitude and the differential amplifier 17 will have a zero voltage output. Accordingly, only when the finger sets 11 or 12 experience different radiation exposures to provide a difference in voltage potentials is there an output from the differential amplifier 17.

As previously mentioned with reference to FIG. 4, the purpose of the apertures 8 in the front wall 3 is to insure that a radiation source moving about within the sensing proximity of the detector 1 is on a line of sight with primarily only one set of fingers 11 or 12 at a time, and alternatively exposes the finger sets 11 and 12 during its movement. The potential difference between the sets of fingers 11 and 12 switches polarity in correlation with the alternating exposure and, thus, the output of the amplifier 17 has alternating positive and negative pulses. The full wave rectifier 18 receives the output of the amplifier 17 and transforms it into a pulsating positive D.C. signal which is applied to the voltage amplifier 19. The pulsating D.C. output of the rectifier 18 is increased substantially by the amplifier 19 and is then passed on to the Schmitt trigger 20. In a conventional manner the Schmitt trigger 20 produces a uniform pulse train in response to the pulsating D.C. from the amplifier 17, whereby each even numbered pulse of the train represents voltage appearing on one set of the fingers 11 or 12 and each odd numbered pulse represents the voltage developed on the other finger set 11 or 12.

The pulse train output of the Schmitt trigger 20 is fed to the input of a pulse counter 21 that may be set to respond to the receipt of at least a predetermined number of pulses within a certain period. Upon receiving the predetermined number of pulses, the counter 21 delivers an actuating pulse to the alarm 22, the sounding of which indicates that a moving infrared radiation source has been detected. Thus, the detector 1 may be preset so that a single pulse will not cause the alarm 22 to trigger. Preferably the counter 21 is adjusted so that it will trigger the alarm 22 when a count of three or more pulses is made, and the count must be made within certain periods of time because the counter 21 is timed in two respects. Firstly, each pulse of the count must be received within a predetermined first time period following the immediately preceding pulse to prevent the counter from resetting and beginning a new count. Secondly, if three pulses are not received by the counter 21 within a predetermined second time period, the counter 21 will reset in readiness for a new count. Such timed counts insure that the detector will be relatively insensitive to spurious radiation that could produce false triggering. Thus, the alarm of the detector 1 will not be actuated by a blinking light or some such other device that intermittently emits infrared radiation at a rate not meeting the timing requirements of the counter 21.

Figure 6:
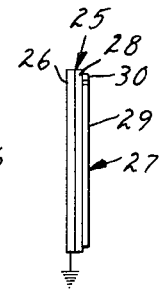
FIG. 6 is an end view of a first modified embodiment of the back wall of the detector of FIG. 1, with the thickness of the layers forming the back wall enlarged.

The above described embodiment is immunized from detecting spurious radiation, but it is possible that false triggering of the detector 1 may result from an exposure to a concentrated plurality of electrostatic charges of the same polarity. An exposure of this sort may occur, for example, when someone approaches the detector because the human body has a net negative electrostatic charge. Upon exposure of one of the finger sets 11 or 12 to such a charge, electrons in the finger set exposed will be repelled from the source of the charge, producing a current flow, and it is possible that the current flow may be sufficient to produce a triggering of the detector 1. To protect the detector 1 from false triggering due to spurious electrostatic charges of one polarity, the arrangement of the back wall 7 may be modified. Referring now to FIG. 6, a back wall 25 for achieving this purpose is shown. The wall 25 has a three layer construction that includes an electrically grounded, conductive inner layer 26, an etched conductive outer layer 27 and an intermediate pyroelectric layer 28; all three layers being in surface-to-surface physical contact. The etched layer 27 has two sets of electrically unconnected, interdigitated sets of fingers 29 and 30 resembling the finger sets 11 and 12 of the back wall 7, and preferably the outer surface of the layer 27 may be coated with a radiation reflective material. Because the finger sets 29 and 30 form the outer layer 27 of the back wall 25, exposure of the detector 1 to spurious electrostatic sources will not induce current flow therein. Instead, the grounded layer 26 acts as a shield, isolating the remainder of the wall 25 from all electrostatic sources. Exposure of the inner layer 26 to radiation will not produce a detection indication by the detector 1 because the current produced by such exposure will be conducted directly to ground.

Figure 7:
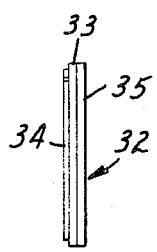
FIG. 7 is an end view of a second modified embodiment of the back wall of the detector of FIG. 1, with the thickness of the layers forming the back wall enlarged.

It is not essential to the present invention that the back wall of the detector 1 is grounded. Instead, as indicated by FIG. 7, the detector may be formed from a back wall 32 that includes a pyroelectric layer 33 that is sandwiched between an etched inner conductive layer 34 and an outer conductive layer 35, neither of which are grounded.

What is claimed is:
1. A temperature compensated sensing device for detecting the presence of a particular condition, which sensor comprises:
    first and second conductive layers, at least one of said layers is formed to provide at least two electrically unconnected conductive portions and the other of said layers is electrically grounded, with said first layer having at least one area that is exposed to and heated by said condition;
    a layer of poled, pyroelectric material interposed between and in surface-to-surface contact with said conductive layers and having at least one area that is heated by said heated area of said first conductive layer to result in the development of electrostatic charges on said heated pyroelectric area and one of the conductive portions in contact with said heated pyroelectric area; and
    a sensing circuit for responding to the development of said electrostatic charges and providing an indication of the presence of said condition, which sensing circuit includes a differential amplifier that is electrically connected to said electrically unconnected conductive portions to prevent actuation of the detector when the voltage potentials of the conductive portions are equal.
2. A sensing device as recited in claim 1 wherein said pyroelectric material is formed from polyvinylidene fluoride.
3. A sensing device as recited in claim 1 wherein said first conductive layer is formed to provide the unconnected conductive portions and said second conductive layer is electrically grounded.
4. A sensing device as recited in claim 1 wherein said second conductive layer is formed to provide the unconnected conductive portions and said first conductive layer is electrically grounded.

* * * * *